United States Patent

Lou et al.

[11] Patent Number: 5,932,487
[45] Date of Patent: Aug. 3, 1999

[54] METHOD FOR FORMING A PLANAR INTERMETAL DIELECTRIC LAYER

[75] Inventors: Chine-Gie Lou, Hsinchu Hsien; Yeur-Luen Tu, Taichung, both of Taiwan

[73] Assignee: Worldwide Semiconductor Manufacturing Corporation, Hsinchu, Taiwan

[21] Appl. No.: 09/041,864

[22] Filed: Mar. 12, 1998

[51] Int. Cl.[6] .......................... H01L 21/283; H01L 21/316
[52] U.S. Cl. .......................... 438/692; 438/758; 438/761; 438/780; 438/785; 438/787
[58] Field of Search .................................... 438/624, 637, 438/692, 758, 761, 780, 785, 787

[56] References Cited

U.S. PATENT DOCUMENTS 4,585,490  4/1986  Raffel et al. ............................. 438/799
4,879,257  11/1989  Patrick ..................................... 438/624

*Primary Examiner*—Benjamin Utech
*Assistant Examiner*—Lynette T. Umez-Eronini
*Attorney, Agent, or Firm*—Christensen O'Connor Johnson & Kindness PLLC

[57] ABSTRACT

A method of forming a planar intermetal dielectric over conductive metal structures is disclosed. The method comprises the steps of: (1) forming a liner oxide layer over the conductive metal structures; (2) forming a spin on glass layer over the liner oxide layer; (3) forming a cap oxide layer over the spin on glass layer; (4) forming a TiN layer over the cap oxide layer; (5) patterning and etching a contact hole through the TiN layer using the cap oxide layer as an etching stop; and (6) etching the cap oxide, the spin on glass, and the liner oxide down to the conductive metal structures using the TiN layer as a mask.

16 Claims, 1 Drawing Sheet

METHOD FOR FORMING A PLANAR INTERMETAL DIELECTRIC LAYER

TECHNICAL FIELD OF THE INVENTION

This invention relates to semiconductor manufacturing processes, and more particularly, to a method for forming an intermetal dielectric layer.

BACKGROUND OF THE INVENTION

Intermetal dielectric layers are commonly used to isolate conducting structures, such as metal layers, from subsequently deposited conducting layers. Intermetal dielectric layers are also useful in performing a planarization function. A typical prior art process for forming an intermetal dielectric layer consists of depositing multiple layers of oxide over the underlying metal layer. For example, a layer of silicon dioxide first covers the metal layer, followed by a spin on glass layer, followed by a second layer of silicon dioxide. The multiple layers of oxide are then patterned and etched to form via holes through to the underlying metal layer.

However, it has been found that during the stripping of the photoresist layer used in masking the etching of the oxide layers, the spin on glass at the sidewall of the via hole is exposed to oxygen plasma. Therefore, the moisture absorption of spin on glass damaged by the oxygen plasma treatment can be several orders of magnitude higher than that of cured spin on glass. The oxygen plasma used to strip the photoresist contaminates and adversely deteriorates the inner sidewalls of the via holes. The term used for this contamination is "poisoned via". See "A Study of Plasma Treatments on Siloxane SOG", C. K. Wang et. al., at page 101, VMIC (1994).

Conventional methods to solve the poison via problem are exemplified by U.S. Pat. Nos. 5,643,407 to Chang and 5,665,657 to Lee. However, these approaches attempt to solve the problem by minimizing the effect of the oxygen plasma.

What is needed is a method for forming a planarized intermetal dielectric layer without contamination during the stripping of the photoresist.

SUMMARY OF THE INVENTION

A method of forming a planar intermetal dielectric over conductive metal structures is disclosed. The method comprises the steps of: (1) forming a liner oxide layer over the conductive metal structures; (2) forming a spin on glass layer over the liner oxide layer; (3) forming a cap oxide layer over the spin on glass layer; (4) forming a TiN layer over the cap oxide layer; (5) patterning and etching a contact hole through the TiN layer using the cap oxide layer as an etching stop; and (6) etching the cap oxide, the spin on glass, and the liner oxide down to the conductive metal structures using the TiN as a mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
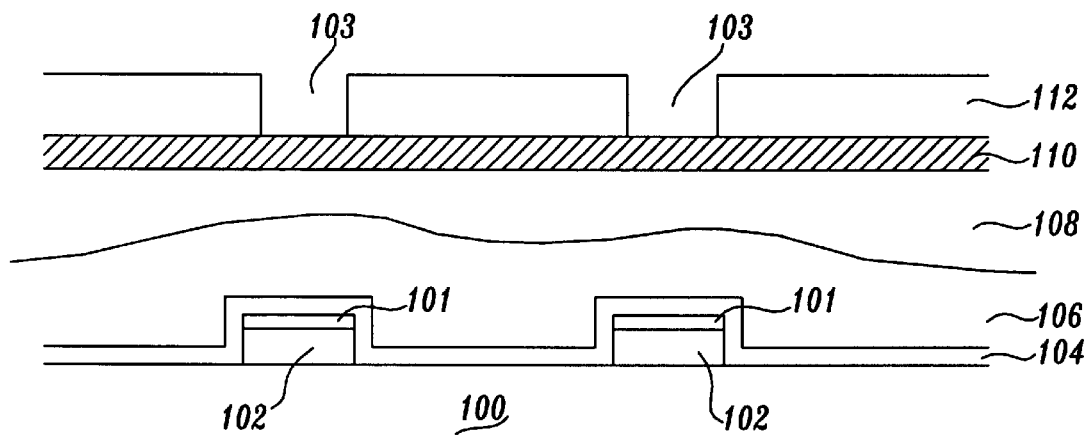
FIGS. 1–3 are cross-sectional views of a semiconductor substrate illustrating the steps of the present invention.

Turning to FIG. 1, a substrate 100 has a plurality of conductive structures 102 formed thereon. The term "substrate" is understood to possibly include a semiconductor wafer, active and passive devices formed within the wafer, and layers formed on the wafer's surface. Thus, the term "substrate" is meant to include devices formed within a semiconductor wafer and the layers overlying the wafer.

The conductive structures 102 are typically metal interconnects or any other conductive structure. Additionally, the conductive structures 102 have a thin anti-reflective coating (ARC) 101 located atop the conducting structures 102. The anti-reflective coating may be, for example, titanium nitride. The use of an ARC 101 atop the conducting structures 102 is well known in the art. Further, it can be appreciated that the structures 102 shown in FIG. 1 is merely exemplary and not meant to be limiting.

In accordance with the present invention, as a first step, a liner oxide layer 104 is deposited over the substrate 100 and the conducting structures 102. The liner oxide layer 104 is preferably silicon dioxide, has a thickness of about 500–1500 angstroms, and is preferably formed using a conventional PECVD technique. The liner oxide serves the purpose of providing a high quality insulator directly over and in immediate contact with the conducting structures.

Next, a layer of spin on glass (SOG) 106 is coated onto the liner oxide layer 104 using conventional techniques. The SOG layer 106 is preferably about 4000–8000 angstroms thick. Alternatively, the SOG layer 106 may be substituted therefore by any of the other well known materials, such as $O_3$-TEOS oxide, fluorine doped silicon glass (FSG), or polymer. Next, a cap oxide layer 108 is deposited and is preferably silicon dioxide, has a thickness of 2000–6000 angstroms (after planarization), and is preferably formed using a conventional PECVD technique. The cap oxide layer 108 serves the purpose of providing a high quality insulator directly in contact with subsequently deposited conducting layers. After the cap oxide layer 108 is deposited, a planarization process, preferably chemical mechanical polishing (CMP), is performed to improve the global planarization of the cap oxide layer 108. The foregoing are conventional steps in forming an intermetal dielectric layer.

After the CMP process, a barrier layer 110 is deposited over the cap oxide layer 108. The barrier layer 110 is preferably formed from a barrier metal layer, such as TiN or Ti, has a thickness of 300–1500 angstroms and is formed using a conventional PVD or CVD technique. After the TiN layer 110 has been deposited, a photoresist layer 112 is coated over the TiN layer 110. The photoresist layer 112 is patterned and developed to leave openings 103 over the conducting structures 102. These openings 103 will, after further processing described below, be transformed into via holes for connecting the conducting structures 102 to other conducting structures on subsequent layers.

Figure 2:
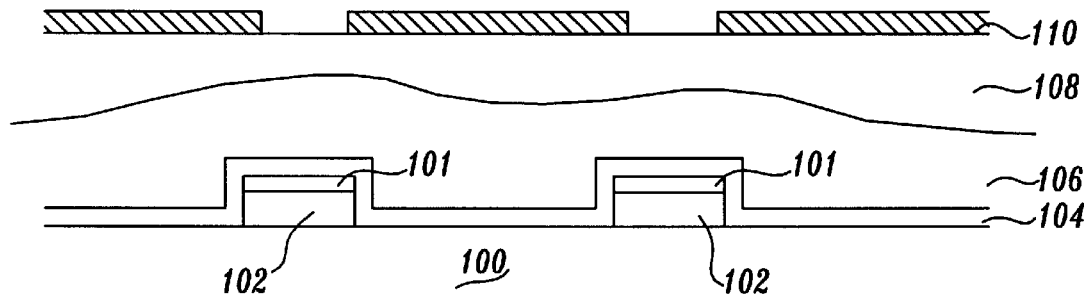

Next, turning to FIG. 2, the TiN layer 110 is etched away using the photoresist layer 112 as a mask to expose the cap oxide layer 108 that lies above the conducting structures 102. Preferably, an anisotropic reactive ion etching process is used to etch the TiN layer 110. After the TiN layer 110 has been etched, the photoresist layer 112 is stripped away. Notice that because the photoresist layer 112 is stripped away prior to etching through the cap oxide layer 108, the SOG layer 106, and the liner oxide layer 104, the oxygen plasma used to remove the photoresist layer 112 cannot damage the spin on glass layer at the sidewall of the via hole.

Figure 3:
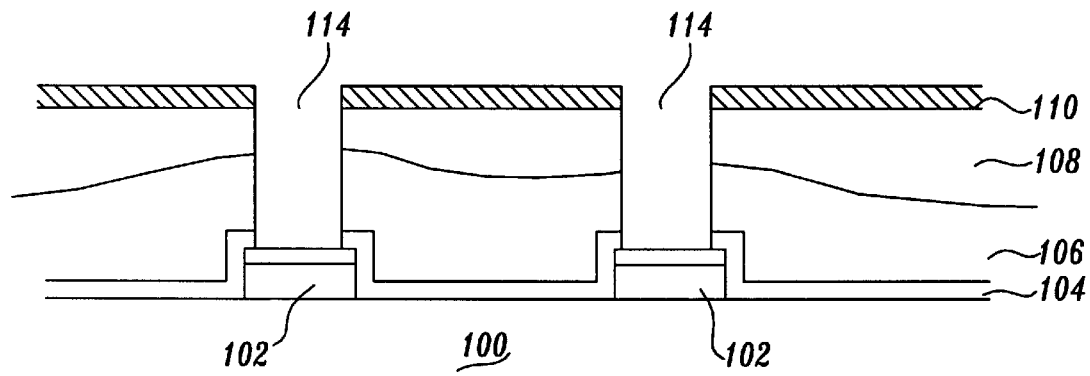

Next, turning to FIG. 3, the remaining portions of the TiN layer 110 is used as a mask to etch the cap oxide layer 108, the SOG layer 106, and the liner oxide layer 104. It is preferable that an anisotropic reactive ion etching be used to remove the cap oxide layer 108, the SOG layer 106, and the liner oxide 104. The resulting structure of FIG. 3 shows via holes 114 formed through the TiN layer 110 and the oxide layers 108, 106, and 104 to the conducting structures 102.

After the via holes 114 are formed, as in the prior art, a further layer of TiN is deposited into the via holes 114, followed by the formation of the tungsten plug. Finally, it is preferable that the tungsten and the TiN layer is processed using CMP to form the final tungsten plug in the via holes 114.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a planar intermetal dielectric over conductive metal structures, the method comprising the steps of:

forming a liner oxide layer over the conductive metal structures;

forming a spin on glass layer over the liner oxide layer;

forming a cap oxide layer over the spin on glass layer;

forming a barrier layer over the cap oxide layer;

patterning and etching a contact hole through the barrier layer using the cap oxide layer as an etching stop; and etching the cap oxide layer, the spin on glass layer, and the liner oxide layer down to the conductive metal structures using the barrier layer as a mask to form a via hole.

2. The method of claim 1 wherein said barrier layer is a barrier metal layer.

3. The method of claim 1 wherein said barrier layer is TiN.

4. The method of claim 1 wherein said barrier layer is Ti.

5. The method of claim 1 further including the step of depositing a further layer of TiN into said via hole.

6. The method of claim 5 further including the step of depositing a tungsten plug into said via hole.

7. The method of claim 1 wherein the thickness of said barrier layer is at least 300 angstroms.

8. The method of claim 1 wherein the step of patterning and etching said barrier layer includes the steps of:

coating a photoresist layer onto said barrier layer;

exposing said photoresist layer to an exposing light through a reticle mask so as to remove a portion of the photoresist layer covering said contact hole;

developing said photoresist layer; etching said barrier layer using said photoresist layer as a mask; and stripping said photoresist layer.

9. A method of forming a via hole through to a conducting structure underlying an intermetal dielectric layer, said method comprising the steps of:

forming an oxide layer over said conducting structure, wherein said oxide layer comprises a liner oxide layer, a spin on glass layer, and a cap oxide layer;

forming a barrier layer over said oxide layer;

patterning and etching said barrier layer to produce a contact hole in said barrier layer;

using said barrier layer as an etching mask, etching said oxide layer under said contact hole to reach said conducting structure to form said via hole.

10. The method of claim 9 wherein said barrier layer is a barrier metal layer.

11. The method of claim 9 wherein the thickness of said barrier layer is at least 300 angstroms.

12. The method of claim 9 wherein said barrier layer is TiN.

13. The method of claim 9 wherein said oxide layer comprises a liner oxide layer, an $O_3$-TEOS oxide layer, and a cap oxide layer.

14. The method of claim 12 wherein said oxide layer comprises a liner oxide layer, an $O_3$-TEOS oxide layer, and a cap oxide layer.

15. The method of claim 9 wherein said barrier layer is Ti.

16. The method of claim 9 wherein the step of patterning and etching said barrier layer includes the steps of:

coating a photoresist layer onto said barrier layer;

exposing said photoresist layer to an exposing light through a reticle mask so as to remove a portion of the photoresist layer covering said contact hole;

developing said photoresist layer;

etching said barrier layer using said photoresist layer as a mask; and stripping said photoresist layer.

* * * * *